United States Patent [19]

Mullen

[11] Patent Number: 5,278,524
[45] Date of Patent: Jan. 11, 1994

[54] MULTI-LAYERED PRINTED CIRCUIT BOARD WITH TRANSMISSION LINE CAPABILITIES

[76] Inventor: Urban E. Mullen, 4014 Cody Rd., Sherman Oaks, Calif. 91403

[21] Appl. No.: 881,427

[22] Filed: May 11, 1992

[51] Int. Cl.$^5$ .................................. H01P 3/08
[52] U.S. Cl. ............................. 333/1; 333/238; 361/792
[58] Field of Search ............ 333/1, 128, 136, 238, 333/246; 361/414

[56] References Cited

U.S. PATENT DOCUMENTS

| | | | |
|---|---|---|---|
| 4,047,132 | 9/1977 | Krajewski | 333/238 |
| 4,560,962 | 12/1985 | Barrow | 333/238 X |
| 4,812,792 | 3/1989 | Leibowitz | 333/238 |
| 4,845,311 | 7/1989 | Schreiber et al. | 333/1 X |
| 4,854,038 | 8/1989 | Wiley | 333/238 X |
| 4,904,968 | 2/1990 | Theus | 333/246 |
| 5,150,088 | 9/1992 | Virga et al. | 333/238 |

*Primary Examiner*—Paul Gensler
*Attorney, Agent, or Firm*—Ladas & Parry

[57] ABSTRACT

A multi-layered printed circuit board for mounting and interconnecting the terminals of multi-terminal electronic components. The circuit board mounts the electronic components one side of the circuit board and provides for interconnecting the terminals of the electronic components. A transmission line arrangement is configured from layers of the circuit board for distributing a signal with fast rise and fall times to electronic components mounted on the circuit board. The transmission line arrangement includes a narrow conductive strip surrounded by four constant voltage conductors spaced from the narrow conductive strip by dielectric material. The constant voltage conductors comprise a first planar conductive layer above the narrow conductive strip and spaced therefrom by one of the dielectric layers, a second planar conductive layer below the narrow conductive strip and spaced therefrom by the other dielectric layer, and a pair of coplanar conductive strips between the two layers of dielectric material and lying parallel to and coplanar with the narrow conductive strip, one on each side of the narrow conductive strip. The invention additionally encompasses a panel board embodiment in which the transmission line arrangement, including at least two constant voltage planes surrounding the narrow conductive strip, is embedded in the multi-layered board.

24 Claims, 2 Drawing Sheets

MULTI-LAYERED PRINTED CIRCUIT BOARD WITH TRANSMISSION LINE CAPABILITIES

BACKGROUND OF THE INVENTION

1. Field of the Invention

This invention relates to multi-layered printed circuit boards for mounting and interconnecting the terminals of electronic components. More specifically, the invention resides in an improvement in such boards wherein high speed signals are routed along a path having the characteristics of a transmission line.

2. Brief Description of the Prior Art

Multi-layered printed circuit (PC) boards are generally of two types. Both types may have alternating layers of conductive and insulating material, the conductive layers carrying power, ground, and/or signals to be routed between the pins of the electronic components mounted on the board.

A first type of multi-layered printed circuit board, referred to herein as a panel board, uses a number of sockets and discrete wiring. The class of panel boards include:

Stitch-Wiring, where the interconnecting wires are welded to either the sockets or to pads on the printed circuit board which in turn are connected to the sockets;

IDC, or Insulation Displacement Connections, in which the insulated wires are forced down into grooves or forks on the wiring end of the sockets;

Soldering, where the insulated wires are soldered, directly or indirectly, to the sockets; and Wire-wrap, described in Leary et al., U.S. Pat. No. 4,494,172 and others, where socket terminals are held in mounting holes in the insulative layers of the board. The socket terminals have sockets on one end for insertion of leads of electronic components, and posts on the other end for wrapping wire to make connections.

As used in this specification, the term "panel board" will be understood to mean any of the above type boards or other boards to come in the future which have the design flexibility of being wired into different configurations by. interconnecting wires or other conductors not part of the printed circuit conductive layers themselves.

A second type of multi-layered printed circuit board (having "dedicated", custom, printed circuit interconnects) has no wire-wrap or other wire interconnect pins and makes all connections using patterns in the various conductive layers of the board. This second type of board usually has the power distribution planes located on the inner layers and many of the clocks and signals on the outer layers. This gives this type of board an advantage over the more general purpose "panel boards" described above which must use the board's outer layers for power and ground distribution.

While the present invention is equally applicable to all types of printed circuit boards, the distinction between "panel" (first type) and "dedicated" (second type) PC boards is made, because special consideration of high speed interconnection schemes have been ignored in panel boards, while some attention has been given to high speed signal distribution for many years in dedicated PC boards.

All of the above may be referred to as "wiring to directly interconnect electronic components". This definition differentiates dedicated printed circuit and panel boards from back plane wiring which simply distributes clocks from board to board.

It is important to recognize that the class of panel boards uses the panel to support the sockets and the decoupling capacitors and uses conductive layers to provide low impedance paths for power and ground. The component's power and ground pins are connected to the required or ground plane by means of solder clips or solder washers which connect the pin's socket to one of the board's outer layers. While this approach virtually guarantees that the components will see good clean power and ground, it rules out the use of the outer layers as a means of distributing clocks and timing signals. The result is that the user must design and maintain the board's clock distribution system using discrete wires or possibly twisted pairs of wires.

A Technician's initial design task involves estimating the propagation delays and adjusting the clock's routing to insure that these delays do not result in contention or conflicts. The main challenge here is keeping track of the clock's propagation delays and of the using device's requirements.

The maintenance of the clock distribution system during test and check out is a far more demanding and error prone task that tends to significantly increase the cost of developing and debugging a new digital system. As a design develops and matures, modifications are required that result in moving clock lines about and adding or deleting loads from the various clock lines. These modifications cause significant changes in the clock's propagation delays which in turn can cause a loss of operating and timing margins. The loss of these margins (the most important of which are data input setup and hold times) cause a digital system to become erratic, lose data, and to be very sensitive to changes in temperature and power supply voltages.

The purpose of an interconnection line in any digital system is to transmit information from one point of the system to another. For many electronic devices, the routing of signals through the conductive paths of a standard printed circuit board causes no difficulty in the integrity of the transmitted signal, since the lines are rather short, usually under 380 mm (15 inches) in length, and the frequency of the signals on the conductive paths can be rather low and may have slow rise and fall times. Moreover, the delay time along the line is of little or no concern, and in the time domain of concern, signal skew from line to line is insignificant. A typical example would be a hand or desk calculator wherein the clock rate for such devices is under 10 MHz.

However, as circuit speeds become faster and clock rates increase, the dynamic behavior of the interconnection line becomes increasingly important. The rise and fall times of logic elements, loading effects, delay times of the signal paths, and various other transient characteristics, all affect reliable operation of the system in which the circuit board is installed. For example, it is not unusual in fairly sophisticated high speed circuitry today to encounter signals with rise and fall times on the order of 1 nanosecond. In this discussion, the phrase "high speed" will refer to a signal having fast rise and fall times (typically between 0.5 and 3 nsec.) and not to the frequency of the signal having such rise and fall times, since the signals themselves may or may not have high frequency (high speed) changing of logic states.

Thus, independent of the frequency of the signal being transmitted along a conductive path in a printed circuit board, it is the leading and trailing edges which cause difficulty in the receiving circuit ascertaining which logic state is intended and what time that logic state occurs. This is due to many factors including "ringing" which occurs at the transition points between the two logic levels in a digital system. If the ringing is too intense, it may cause false triggering of the receiving circuit, for having passed through logical "1" and "0" states one or more times before settling down to its intended logical state level. On the other hand, if certain circuit components are introduced to reduce such ringing, such as series damping resistors, the ringing may be reduced, but the noise threshold of the system is impaired because of the diminishing of the separation between the logic levels at the output of the sending device and the input threshold levels of the receiving device.

An example of a high speed wire-wrap board can be found in the description and drawings of U.S. Pat. No. 4,494,172 in the name of Leary et al. While Leary et al. addresses the problem associated with the need for capacitive filtering the voltage layers in a multi-layered printed circuit board, and proposes to use close spacing of the voltage layers to provide a large distributive capacitance and thereby not require as many discrete isolation capacitors, Leary et al. does not address the problems associated with ringing on the signal lines carrying high speed signals from one component to another on the board. Leary et al. does recognize that high speed switching devices cause voltage spikes in the power lines and suggests a physical arrangement of the voltage planes and insulative layers as well as the interconnection with wire-wrap socket terminals to provide an improved panel board with minimum interference, through the power distribution layer, by the high speed operation of one device affecting the operation of an adjacent electronic device. Other prior patents related to multi-layered printed circuit boards include: U.S. Pat. No. 3,932,932 to Goodman which teaches the use of thick ground and voltage planes and discusses plated-through technology; and U.S. Pat. No. 4,004,196 to Doucet which uses termination resistors in a common single-in-line package and short wire-wrap pins to improve high speed signal transmission. Reference is also made to the article "HIGH-SPEED-CPU DESIGN, 40-MHz CMOS CIRCUITS SEND DESIGNERS BACK TO SCHOOL" in the magazine EDN, Mar. 2, 1992, Pages 67-76.

In the publication "MECL System Design Handbook", 4th edition, distributed by Motorola Semiconductor Products, Inc., Product HB 205, REV. 1, Pages 173-187, a good explanation is given of the problems associated with transmitting high speed signals along interconnecting paths in a digital system.

At Page 176 of the Motorola publication, a discussion of printed circuit board interconnects can be found. The layout rules discussed, however, refer to Motorola's line of MECL (Motorola Emitter Coupled Logic) devices which are in some ways less sensitive than some of the CMOS (Complementary Metal-Oxide-Silicon) devices used in large scale integration circuits. Accordingly, while the layout rules and suggested approaches to solving ringing problems may be different as between MECL and CMOS devices, the theory set forth in the aforementioned Motorola publication is quite adequate to explain the problems and indeed provides a good background discussion and analysis of the problems.

Page 43 of the Motorola MECL SYSTEM DESIGN HANDBOOK introduces the various types of printed circuit board transmission lines in common use. The Motorola publication recognizes that printed circuit board layouts range from the most simple single layer board with wired interconnects to the most elaborate multi-layered board with a complete transmission line environment. The use of conductive planes for maintaining noise free grounds and voltage supplies is recognized and discussed with similar results as those proposed in the Leary, et al. patent. It is also suggested to maintain constant characteristic impedance wherever transmission lines become necessary.

However, only three types of transmission line geometries are proposed by Motorola, representing the state of the art in printed circuit board interconnect technology (MECL SYSTEM DESIGN HANDBOOK, Pages 41-62 and 173-194). The three types of transmission line geometries are:
1. Wire over ground;
2. Microstrip; and
3. Strip line.

Each type uses a ground plane or a pair of ground planes.

In the wire over ground arrangement, a wire is simply routed from a source to its destination by laying the insulated wire as close as possible to the ground plane. This is useful for breadboard layouts as well as back plane wiring.

The second and third types of transmission line geometries employ conductive paths for the high speed signal in the makeup of the printed circuit board itself. In the microstrip configuration, a narrow width conductive strip is separated vertically from a ground plane by a dielectric medium. The dimensions of the narrow strip and the spacing relative to the ground plane are controlled to establish a pre-determined characteristic impedance.

The third type of line, a strip line, uses a narrow width conductive strip centered in a dielectric medium between two conducting planes. This type of line is used in multi-layered boards, and according to the Motorola publication (Page 179, right hand column), "is not seen in most systems." Furthermore, the publication goes on to state that "Since most designers need not concern themselves with strip lines, little is presented here about them."

U.S. Pat. No. 3,895,435 to Turner et al. teaches a method for interconnecting multilevel strip line circuitry.

The Motorola publication also has a good discussion on transmission line termination techniques beginning at Page 181. As earlier suggested, the approach to minimizing ringing is to provide proper transmission line termination to prevent reflections on the line so that ringing does not occur. Matching the impedance of the transmission line by a termination network accomplishes this objective.

In addition to line length and transmission line terminations, other factors must be considered in high speed systems. System speed requirements will ordinarily be the limiting factor for maximum fanout of the devices of concern. Capacitance increases with fanout and can cause rise and fall times to slow. Thus, as fanout increases, load capacitance (both device and interconnection capacitance) increases, resulting in longer rise and fall times. Larger fanout will normally result in longer interconnecting lines with their longer line delays, so ringing can become excessive. Under these conditions, use of properly terminated lines will result in best performance. A low impedance high-speed signal distribution system is better for driving the high capacitance loading of a large fanout configuration. Characteristic impedances of about 50 ohms to 100 ohms can be readily achieved using easily attainable manufacturing processes in the creation of transmission line configurations for high speed signal distribution in a printed circuit board. For MECL devices, Motorola appears to suggest a 50 ohm transmission line impedance. However, for CMOS devices it has been found more practical to use a characteristic impedance of closer to 100 ohms.

Unterminated line length for high speed lines must be kept to usually under 150 mm (6 inches), and in order to control ringing, fanout is, as indicated, limited. Moreover, as fanout increases, the maximum line length for interconnecting devices diminishes. In the Motorola publication at Page 51, for example, in using a strip line transmission line arrangement, the maximum line length (i.e. maximum un-terminated length) for a 50 ohm characteristic impedance transmission line must be kept shorter than 115 mm (4.5 inches) for a fanout of 8. When characteristic impedances are higher, on the order of 100 ohms, the same strip line transmission line configuration limits the line length to 53 mm (2.1 inches) for a fanout of 8 and even to 71 mm (2.8 inches) or less for a fanout of 4, such limitations being almost prohibitive, especially in a panel board design where it would be practically impossible to interconnect 8 devices with 71 mm (2.8 inches) of wire, and may be even extremely difficult to accommodate a fanout of 4 with that length of wire.

It should be understood that these severe limitations are equally applicable when interconnecting CMOS devices. The figures given above are representative for the MECL 10,100 series circuits but would apply to most modern CMOS devices because the rise and fall times are about the same for the two types of devices (albeit that device impedances are vastly different). One of the most important technical advancements derived from the present invention is the provision of a predictable clock distribution system that reduces the clock distribution uncertainties to a very minimum. The wiring board shown in the attached drawing is typically approximately 233 mm (9 inches) wide and 220 mm (8.5 inches) long. Wiring boards of this size have their clock lines implemented with discrete wires and have clock wiring runs as long as 1 to 2 meters (40 inches to 80 inches). This results in the board's clock signal having a propagation delay of 6 to 12 nanoseconds which is long compared to the typical device's setup and hold time requirements of 0.5 to 6 nanoseconds. It should be noted that the board used for this example is not large many of today's systems are using wiring boards of 400 mm × 400 mm (16 inches × 16 inches) and these boards can easily have clock wire runs of 4 meters (13 feet) or more. In this case the propagation delays are frequently in the 20 to 25 nanosecond range and the checkout and development times tend to soar. Most small or modest digital designs require many man weeks for testing and checkout while the larger boards like the 400 × 400 mm size boards can, and frequently do, require many man months.

It is difficult to quantify, but a very substantial, if not the majority, of the time spent on test and checkout involves problems with the setup and hold times of a device's inputs with respect to clock edges. Logic problems are usually easy to identify and fix. Timing problems, on the other hand, frequently involve a signal that goes true a nanosecond or so too early or too late. The difficulty of localizing this type of error is due to the problem of catching and seeing an event that occurs only at relative long intervals and, in no small part, to the fact that the error or fault tends to appear at a point in the system that is far removed from the place where the error occurred. The result is that the engineers and technicians spend a great deal of their time trouble shooting symptoms instead of causes.

There are several reasons why transmission line arrangements according to the prior art are unable to accommodate long lengths of line without encountering a ringing problem. One is that termination networks were either not used or were inadequate in a panel board environment. Another is that the "transmission line effect" defined by a pair of power planes above and below a thin narrow conductive strip sandwiched between two insulative layers in a "dedicated" PC board does not sufficiently confine the narrow strip with the result that the characteristic impedance varies over the length of the line as the narrow conductive strip passes by, and perhaps parallel to, other signal lines carrying fast changing signal information. Additionally, if the narrow conductive strip is a clock line, it may be influenced significantly by an adjacent clock line which is coplanar with it, since the upper and lower ground planes serve no capacity in isolating the clock lines or any other signal lines from the clock line of concern.

Thus, a narrow width conductive strip sandwiched between two ground planes does not approach the geometric configuration of a standard coaxial cable which has proven to be a very effective means for transmitting high speed signals across many feet of transmission length. Also, the lack of any isolation between clock lines or any other signal lines also represents a far departure from a standard coaxial transmission line in which the outside ground shielding would totally encapsulate and isolate the inner conductor and prevent cross interference between adjacent signal carrying lines. Moreover, in wiring panel boards, the use of embedded transmission line arrangements have not been used heretofore in any configuration.

It is therefore clear that there is a need for an improvement over the prior art printed circuit board arrangements, for the distribution of high speed signals along the signal path, which improvement would more closely approach the characteristics of a classical transmission line and would reduce cost associated with the design and development of digital systems. The present invention fulfills these needs.

SUMMARY OF THE INVENTION

The present invention overcomes the aforementioned deficiencies of the prior art by providing a multi-layered printed circuit board for mounting and interconnecting the terminals of multi-terminal electronic components with an improved high speed transmission line arrangement. The present invention has for its objectives to: reduce the cost of designing and debugging high speed logic systems by eliminating or at least minimizing the uncertainties associated with conventional clock distribution schemes; reduce conducted and radiated electromagnetic interference by shielding and terminating clock distribution lines and by filtering the clock driver's power lines; reduce noise on internal signal and power lines by shielding and terminating clock distribution lines and by filtering the clock driver's power lines; provide terminating networks that the user can adapt to unique circuit requirements; and reduce inductive reflections on the clock lines by using or providing for the use of surface mounted components in the terminating networks.

According to one embodiment of the invention, the circuit board comprises: means for mounting the electronic components one side of the circuit board; means for interconnecting the terminals of the electronic components; and a unique transmission line arrangement configured from layers of the circuit board for distributing a signal with fast rise and fall times to electronic components mounted on the circuit board. The transmission line arrangement includes a narrow conductive strip surrounded by four constant voltage conductors spaced from the narrow conductive strip by dielectric material.

In the simplest form of this embodiment of the invention, the transmission line arrangement comprises two layers of dielectric material, the narrow conductive strip carrying the signal along a conductive path between the two layers of dielectric material. The constant voltage conductors comprise a first planar conductive layer above the narrow conductive strip and spaced therefrom by one of the dielectric layers, a second planar conductive layer below the narrow conductive strip and spaced therefrom by the other dielectric layer, and a pair of coplanar conductive strips between the two layers of dielectric material and lying parallel to and coplanar with the narrow conductive strip, one on each side of the narrow conductive strip.

The geometry of the narrow conductive strip, the distance between the narrow conductive strip and the surrounding first and second planar conductive layers and pair of coplanar conductive strips, and the characteristics of the dielectric material are chosen to define a predetermined characteristic impedance for the transmission line arrangement. Typically, this characteristic impedance is in the range of about 50 ohms to 100 ohms. Providing a coplanar ground strip on each side of the narrow clock line more nearly approaches the geometric configuration of a standard coaxial cable. This offers the practical advantage of providing an addition ground return path for the clock signals and shielding from adjacent coplanar clock lines.

In order to minimize or eliminate ringing, the circuit board comprises a termination network at the terminating end of the transmission line arrangement, the termination network having the same equivalent impedance as the characteristic impedance of the transmission line arrangement.

For distribution of clock by means of the transmission line arrangement on a circuit board, a microelectronic distributor device may be provided to send the clock along a plurality of conductive paths, each path consisting of the elements making up the transmission line arrangement, thereby defining a plurality of transmission line arrangements distributing the clock to separate regions of the circuit board. Preferably, each path is the same length from its sending end to its terminating end, exhibits the same capacitance, and compensates for extrinsic clock skew as discussed in the aforementioned EDN article at Page 70. The intrinsic skew of the microelectronic distributor is compensated for by varying the length of the circuit leads that supply the clock signal to the distributor. Most micro circuits that would be used for this application (clock distribution) have an internal skew of plus or minus a half of a nanosecond which can be compensated for with 20 to 60 mm (1.25 to 2.5 inches) of wire.

In another embodiment of the invention, limited to application to panel boards, the use of an embedded transmission line arrangement of any type represents a departure from the prior art in which multi-layered panel boards were limited to ground and power planes.

A typical clock distribution scheme of this invention would have, as shown in the drawing, a number of lines each of which has the same electrical length and capacitance and each having 10 or more tie points. By carefully controlling the routing of the various clock traces, it is possible to reduce the uncertainty of the clock's propagation delay to an insignificant 25 picoseconds (7 ps/mm×3.5 mm). The result is that the designer's tasks of designing and maintaining the integrity of the clock distribution system is simplified to one of following a few simple design rules:

1. Cluster time critical logic elements reasonably close together—to within 50 to 70 mm of each other;
2. Insure that the length of the stubs or lines attached to the clock's transmission line are limited to a maximum of 50 mm to 75 mm (2 inches to 3 inches). The desire here is to make sure that any reflections back down the stub take place during the clock's rise or fall time;
3. Distribute the clock loads evenly across the various clock lines. This will insure that the clock's rise and fall times will, on the various traces, remain nearly equal; and
4. Place a maximum of 2 stubs on a given transmission line tap or tie point. The desire here is to maintain a reasonably distributed loading on the clock lines.

The above rules are easy to follow, because every place on the board according to the present invention is within 50 mm to 75 mm (2 inches to 3 inches) of two or three clock lines and the design is limited to a total of to 14 tie points. The desire is to make sure that the capacitive loading of the clock lines does not become excessive and that, as mentioned, all ringing due to the stub lines has dampened out during the clock's rise and fall times (3-4 nanoseconds). Tradeoffs of line lengths, number of tie points, and number of stubs per tie point are thus possible if done with discretion.

While the concepts of the present invention can be employed in virtually any type of multi-layered printed circuit board, it is uniquely applied to panel boards, the interconnection between electronic components on the board being implemented by interconnecting discrete wires terminal to terminal, for example by using a wire-wrap tool. Such printed circuit boards can be used for breadboarding or can become a production item when the market does not demand a large number of printed circuit boards to be manufactured. In either case, it is important to have reliable clock distribution, and in the past this has only been achievable by an expensive procedure using twisted pair interconnects requiring longer lengths, exposure to a more noisy environment, and the manual interconnecting of four wire ends for each length of distribution line for the clocks. While microstrip or strip line designs could also be used for such boards, although heretofore they have not, even these designs have problems as before-described.

Since the high speed signal on the narrow conductive strip of a transmission line arrangement in accordance with the invention is well protected from adjacent signal interference sources, the complement of conductive layers and dielectric layers making up the transmission line arrangement can be embedded within a larger multi-layered printed circuit board which comprises a plurality of additional conductive and dielectric layers, the conductive layers including voltage planes and signal distribution layers.

For high fanout distribution of signals (e.g. clock), a plurality of taps extend into the printed circuit board to contact the narrow conductive strip along its path, each tap including a terminal element on one side of the circuit board for access to the signal being distributed along the transmission line arrangement. Although it is advisable to widen the narrow strip at the point of contact with the tap pin, the geometries of the narrow conductive strip and the coplanar conductive strips on either side at the tap region are adjusted to maintain the aforementioned characteristic impedance at the tap.

Since the known benefits of a transmission line depend upon the conductor or conductors surrounding the central signal line being of constant and noiseless voltage, connecting the four conductive layers surrounding the narrow conductive strip of the transmission line arrangement according to the invention to system ground is an ideal design. If the constant voltage conductors surrounding the narrow conductive strip are properly filtered, however, voltage planes and signal return planes can also be employed.

BRIEF DESCRIPTION OF THE DRAWING

The invention will now be described in detail having reference to the accompanying drawing in which.

DETAILED DESCRIPTION OF THE PREFERRED EMBODIMENTS

Figure 1:
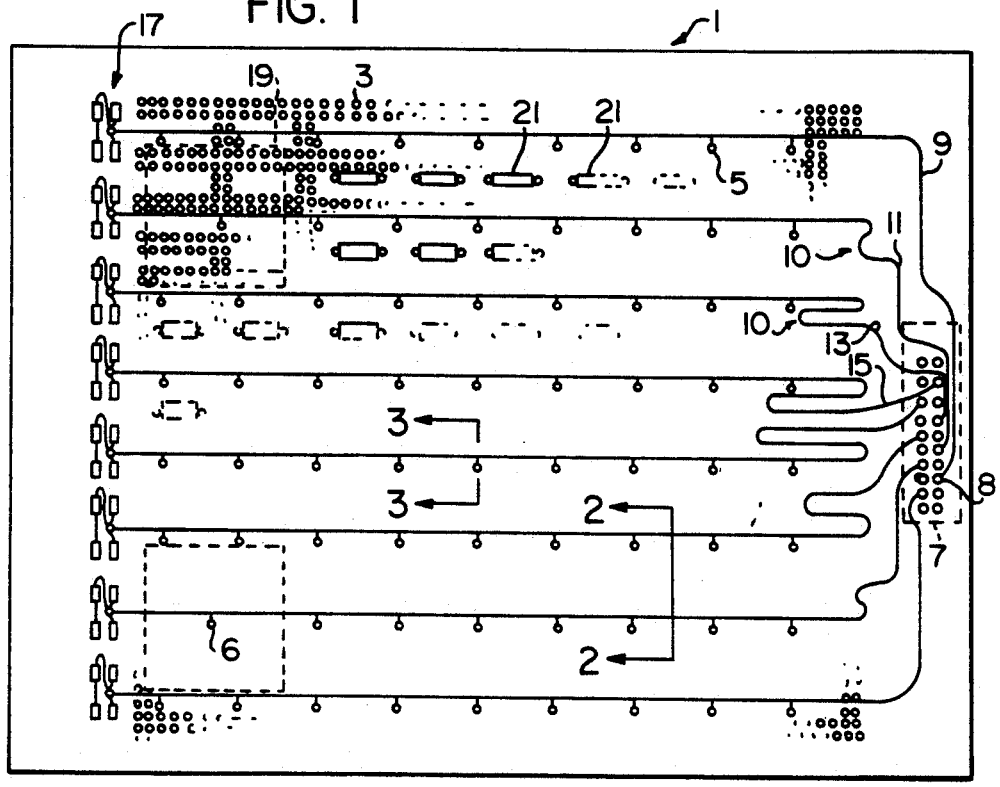
FIG. 1 is a plan view of a multi-layered printed circuit board made in accordance with the invention, with the signal distribution lines and interconnection points therealong being schematically represented.

FIG. 1 illustrates the general layout of a printed circuit board incorporating the features of the present invention. The illustration of FIG. 1 is partially the plan view of one implementation of the invention and partially schematical. The components shown by solid or dotted lines would be visible to the observer in the plan view of the circuit board, but the routing of signal lines is represented schematically, since such signal lines are to be carried between layers of the printed circuit board.

In FIG. 1, a printed circuit board 1 is shown to have a number of geometrically arranged interconnect terminals (e.g. wire-wraps pins) 3 generally arranged in a configuration which has been used by those skilled in the art for many years. A signal driver 7, typically a clock driver, receives input and distributes clock among the chip's several outputs to distribution lines 9, 11, 13, and 15. The clock driver 7 typically has many separate inputs which may or may not be receiving the same signal. That is, a number of different clocks can, and in many cases will, be distributed throughout the board. Such distribution lines serve the upper half of a board as illustrated in FIG. 1, and a mirror image of such distribution lines are shown on the lower half of the printed circuit board 1. In systems operating slower than about 25 MHz, an octal line driver such as a type 74ALS244A can be used. However, primarily due to the maximum permissible clock skew of approximately 3 nsec. in systems operating at a clock frequency of higher than 25 MHz, line drivers having specified intrinsic skews of 1 nsec. or less must be used. For these applications, possible line drivers include Integrated Device Technology's 49FCT805, Motorola's MC10H641, and Texas Instruments' 74ACT11208. Intrinsic skew can be compensated for, as described above, by varying the length of the clock driver's input leads.

The distribution of high speed signals by line driver 7 would include any type of signal, but in the example given in this description, it will be assumed that the signal to be distributed is a clock signal, and, for the purposes of simplifying this discussion, the term "clock" will be used to represent any high speed signal.

As can be observed, the length for the clock lines leaving line driver 7, from the output pin 8 for each corresponding clock line and extending all the way to a termination network 17, is the same for all lines. To accomplish this, the clock lines 11, 13, and 15 closer to the center of the circuit board 1 have equalizing portions 10 increasing in length toward the center of the circuit board 1. This will ensure equality between the clock lines as to inductance, capacitance, propagation delay, and extrinsic (to the clock driver 7) clock skew at corresponding taps 5 along the distribution lines.

The dotted lines outlining a microcircuit 19 represent the location of specialized chips, such as microprocessor chips which would have their own dedicated clock taps 6 (shown at two locations in the example of the printed circuit board shown in FIG. 1). The taps 5, 6 define a number of tie points which, in the example of FIG. 1 are terminals used to connect the clocks to the desired components/devices that are eventually to be mounted on the board 1.

A number of filter capacitors 21 are shown distributed throughout the circuit board 1 to provide localized filtering of the constant voltage layers on (or within) the printed circuit board 1. Such filter capacitors 21 are of a type, and are connected in a manner, already known in the prior art.

Figures 2A, 2B:
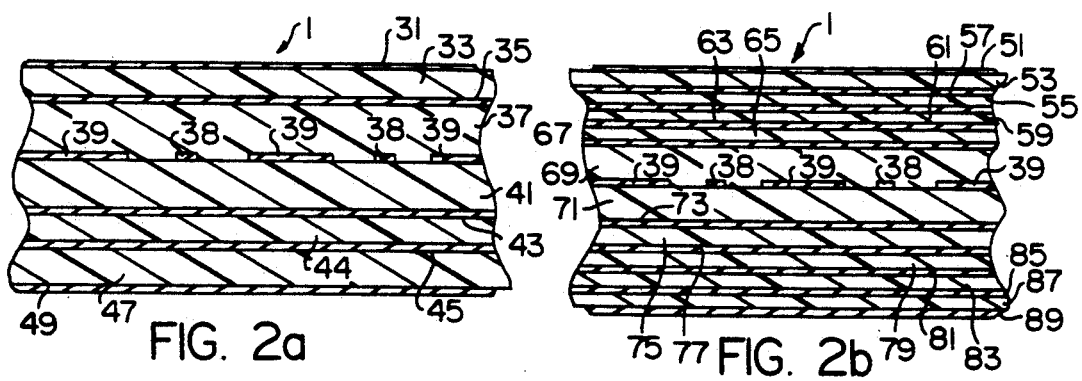
FIG. 2a is a cross-section of one preferred embodiment of the invention depicting the layout of the transmission line arrangement, and is taken along the lines 2—2 in FIG. 1.
FIG. 2b is a cross-section of a second embodiment of the invention, employing a larger number of conductive and dielectric layers, also taken along the lines 2—2 in FIG. 1.

FIG. 2a shows a cross-sectional view of the printed circuit board taken along the lines 2—2 in FIG. 1. A number of constant voltage planes 31, 35, 43, 45, and 49 are typically voltage planes, properly filtered and covering as much area as possible while avoiding contact with terminal pins and plated-through holes passing through the circuit board 1. These voltage planes are deposited on or sandwiched between multiple layers of dielectric material such as glass epoxy and shown in FIG. 2a as layers 33, 37, 41, 44, and 47.

While constant voltage conductive layers 35 and 43 may be common voltage planes for distribution of power and signal line returns in a typical multi-layer circuit board application, in a preferred embodiment of the present invention, these layers 35 and 43 are connected to system ground, since they comprise a part of the transmission line arrangement of the present invention. It is to be understood, however, that with proper filtering and careful connection with the back plane, power supply voltage planes and ground return planes can also be used without departing from the general concept of the present invention.

The clock line as shown in FIG. 2a as a narrow conductive strip 38 centrally located between planar conductive layers 35 and 43, above and below the narrow conductive strip 38, respectively. The narrow conductive clock strip need not be centrally located. In most designs the overall board thickness is fixed by packaging requirements. This means that adjustment of the clock line closer to one of the planar conductive layers. In so doing, one can reduce the line's impedance from that obtained at the central location.

A pair of coplanar conductive strips 39 are arranged laterally and coplanar with the narrow conductive strip 38. Also, the coplanar conductive strips lie parallel to the narrow conductive strip 38 along the entire path of strip 38 shown in FIG. 1 as the clock distribution lines 9, 11, 13, and 15.

It may also be observed by reference to FIG. 2a that the distance between narrow conductive strip 38 and the upper and lower conductive layers 35, 43 is approximately the same as the distance between the lateral sides of narrow conductive strip 38 and the adjacent edges of coplanar conductive strips 39.

It can therefore be appreciated that the transmission line arrangement is comprised of narrow conductive strip 38, dielectric layers 37, and 41, upper and lower conductive layers 35, 43, and coplanar conductive strips 39. Together these components define a "COPLANAR STRIP LINE". The width of the narrow conductive strip 38 is in the range of 0.025 to 0.25 mm (0.001 to 0.010 inches) in preferably in the range of 0.127 to 0.178 mm (0.005 to 0.007) inches. The spacing between narrow conductive strip 38 and the adjacent conductors 35, 43, 39 is approximately 0.75 mm (0.03 inches), and the minimum width of coplanar conductive strip 39 is 0.4 mm (0.015 inches). The latter dimension is not critical but the 0.4 mm dimension has been shown to be effective to electronically isolate the clock signals on adjacent narrow conductive strips 38. With the dimensions given, the characteristic impedance of the transmission line arrangement is approximately 80 ohms.

FIG. 2b shows a cross-section of another type of printed circuit board, again taken along the lines of 2—2 in FIG. 1. In this embodiment, there are simply more voltage planes employed, illustrating that all that is necessary to implement the present invention in a multi-layered printed circuit board is to provide the appropriate physical geometry of the transmission line arrangement and electronic environment (filtering and component placing to reduce noise, etc.). The components making up the transmission line arrangement shown in FIG. 2b are upper and lower conductive layers 67, 73, separating dielectric layers 69, 71, narrow conductive strip 38, and coplanar conductive strips 39. As required by the designer, the printed circuit board of FIG. 2b may also include a multitude of voltage planes 51, 55, 59, 63, 77, 81, 85, and 89, as well as a number of separating dielectric layers 53, 57, 65, 75, 79, 83, and 87.

Figure 2C:
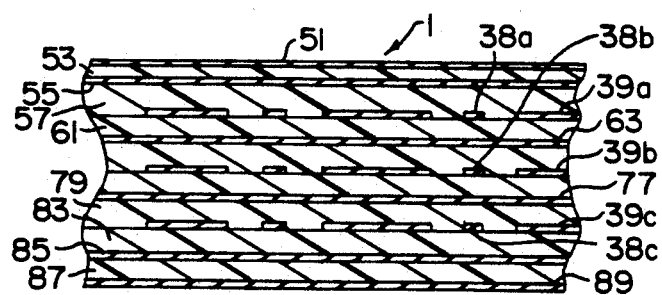
FIG. 2c is a cross-section of a third embodiment of the invention, employing a multiplicity of transmission line arrangements, also taken along the lines 2—2 in FIG. 1.

An alternate design depicting stacked multiple transmission line arrangements is shown in FIG. 2c wherein such transmission line arrangements are made up of narrow conductive strips 38a–c and coplanar conductive strips 39a–c sandwiched between alternate power plane conductive layers 55, 63, 77, and 85. Future applications are anticipated to require many more clock lines than the single one shown in FIGS. 2a and 2b.

It is to be understood that the circuit board configurations of FIG. 2a and FIG. 2b represent the geometry which would be employed in a printed circuit board using interconnect terminals. For the "dedicated" standard multi-layered printed circuit board with interconnecting signal lines on various layers of the multi-layered board, the conductive layers 51, 55, 59, 63, 77, 81, 85, and 89 may comprise voltage planes and/or signal distribution conductive layers. It is essential, however, that conductive layers 35 and 43 of FIG. 2a and conductive layers 67 and 73 of FIG. 2b are not simple interconnect lines but rather well-filtered system ground planes, ground return planes, or voltage planes.

Figure 3:
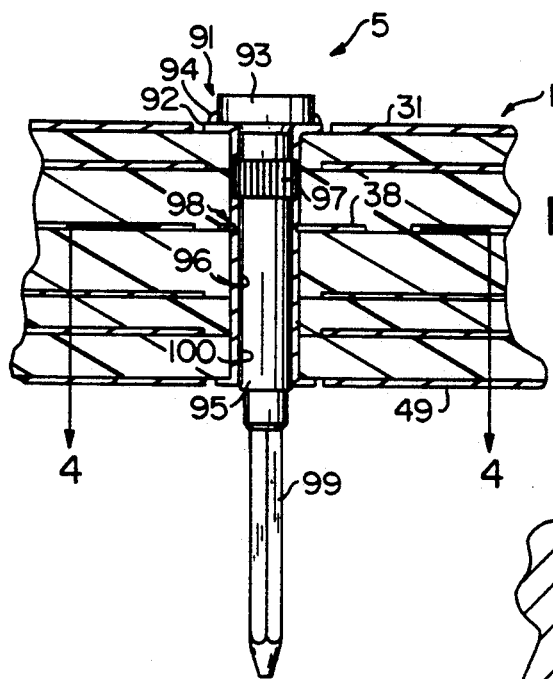
FIG. 3 shows a cross-section of the printed circuit board, taken along the lines 3—3 in FIG. 1, and is similar to that shown in FIG. 2a, but with a wire-wrap pin mounted therein and connected with a narrow conductive strip on one of the conductive layers within the circuit board.

FIG. 3 shows a similar cross-sectional view of the printed circuit board 1 as that shown in FIG. 2a but with a wire-wrap terminal 91 (shown not cross-sectioned) as would be seen if viewed along the lines of arrows 3—3 in FIG. 1. The wire-wrap terminal of FIG. 3 is of standard design having a head 93, a shaft 95, and a knurled section 97 provided to assure a tight interference fit in the hole 100 formed in the printed circuit board 1. A pin 99 extends below the printed circuit board 1 for wrapping with a wire to be connected to another pin portion 99 of another wire-wrap pin in the area. For a stitch-wire board, the configuration of the terminal would be similar to a wire-wrap terminal, except that it would have a small/short head or button sticking out of the wiring board where FIG. 3 shows a wire-wrap post.

In order to make electrical connection with the narrow conductive strip 38, it is advisable to widen strip 38 at the tap point 5. Toward this end, a plated-through conductor 96 is shown extending through circuit board 1 and lining the inner surface of hole 100. It makes contact with narrow conductive strip 38 at junction 98 and extends upwardly to the top of the circuit board 1 to form a flange 92 with which the head 93 of the wire-wrap pin 91 makes contact. To ensure good electrical contact, a solder connection 94 is made between head 93 and the top extension of the plated-through conductor 96.

Figure 4:
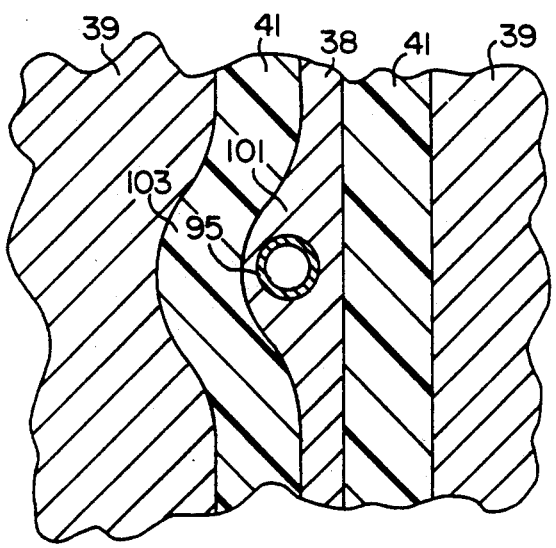
FIG. 4 is a cross-sectional view of the multi-layered printed circuit board with an inserted wire-wrap pin, taken along the lines 4—4 in FIG. 3.

The enlargement of narrow conductive strip 38 at a tap point 5 is best seen in FIG. 4 which shows a cross-sectional view taken along lines 4–4 in FIG. 3. Here, the coplanar conductive strips 39 are shown to be separated from narrow conductive strip 38 by the top surface of dielectric layer 41. However, in the vicinity of the shaft 95 of wire-wrap pin 91, narrow conductive strip 38 is widened to further encompass the outer periphery of shaft 95. In order to maintain constant characteristic impedance of the transmission line arrangement, the spacing about the enlarged portion 101 of narrow conductive strip 38 is enlarged by creating a bend 103 in the appropriate coplanar conductive strip 39.

Figure 5:
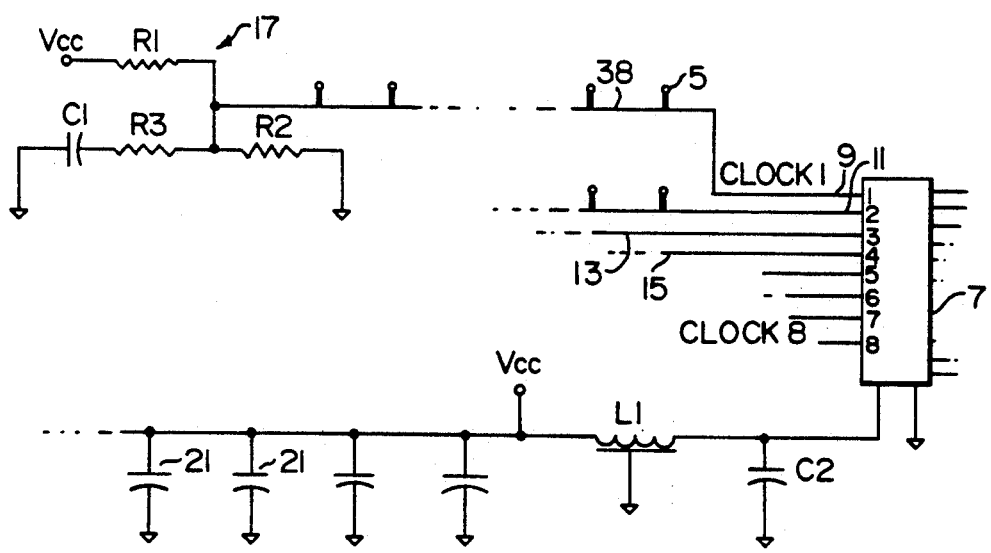
FIG. 5 is a schematic representation of the distribution of high speed signals, termination of the transmission line arrangement, and filtering for the printed circuit board.

FIG. 5 is a schematic representation of the distribution of clock from line driver 7, illustrating that each of the clock lines 9, 11, 13, 15, etc. are carried on narrow conductive strip 38 having taps 5 spaced therealong and that a termination network 17 is provided at the end of the transmission line arrangement. Depending upon the need of the user, various termination designs can be implemented using the four components noted in FIG. 5 for the make up of termination 17. For example, a purely resistive termination could readily be configured comprising R1 and R2 which define a Thevenin equivalent resistor network. In this case, the impedance of the line is matched by the parallel calculation of resistors R1 and R2. In another design, it may be desirable to provide a single resistor R1 to Vcc equal to the impedance of the transmission line, or in the alternative, a single resistor R2 to ground. If the termination is required to not impose a DC level onto the transmission line, R1 and R2 can be eliminated, and the equivalent impedance of the series combination of R3 and C1 will provide the necessary termination impedance to match the characteristic impedance of the transmission line arrangement. Obviously, a large number of other combinations are possible depending upon the need and desires of the circuit designer.

Schematically, FIG. 5 also shows filter capacitors 21 connected between Vcc and ground (see also FIG. 1). To further isolate the clock distribution from the noises on the Vcc voltage plane, a series inductor L1 and filter capacitor C2 may be used to prevent noise generated by the clock driver from getting out to the power distribution system and to the outside world. The clock drivers tend to be a very significant source of radiated and conducted Electro-Magnetic-Interference (EMI). EMI concerns are one of the reasons for terminating the clock lines. The ringing of unterminated clock lines is a major source of system generated EMI. The inductor L1 likewise a-c decouples the line driver circuit 7 from the possible noisy environment of the power plane.

The invention thus includes embodiments of dedicated multi-layered printed circuit boards or panel boards which use the disclosed transmission line arrangement which may be referred to as an embedded COPLANAR STRIP LINE or COPLANAR MICRO STRIP LINE. The invention further includes embodiments of panel boards which use any type of transmission line arrangement, whether strip line or embedded COPLANAR STRIP LINE or COPLANAR MICRO STRIP LINE.

In the above discussion, a number of preferred embodiments of the invention have been discussed. It should be obvious to those skilled in the art that, after presentation of the basic concepts of the transmission line arrangement according to the present invention, various alternate embodiments can be implemented which are not shown or described specifically in this description. In this connection, a printed circuit board 1 with interconnect terminals has been used as exemplary in this description. One of the reasons for this is that, until now, there has not been a panel board product which can provide the necessary electronic environment for reliable distribution of high speed clock and other signals. On the other hand, since the state of the art is edging toward higher and higher clock frequencies, and since the distribution of clocks through circuit boards incorporating clock frequencies of under 25 MHz did not raise a problem and was adequate until now, there was never recognized a need for any special circuit board design to provide a more controlled and effective clock distribution layout for panel boards. While the present invention fulfills that need, it is to be understood that the invention is not limited to panel boards but is equally applicable to any multi-layered printed circuit board wherein clock frequencies above 25 MHz are to be employed.

It is also to be noted that, while many sources disclose transmission line arrangements on printed circuit boards, these have been limited in the past to wire-over-ground, microstrip, and strip line configurations. The present invention provides an improvement over even the best of these transmission line arrangements in the form of a "COPLANAR STRIP LINE" or "COPLANAR MICRO STRIP LINE" transmission line arrangement.

By employment of the invention, meaningful improvement can be realized from reducing uncertainties in the distribution of high speed signals in printed circuit boards. By controlling the routing of the clock lines, one can easily hold the variation in line length to 2-3 mm (0.08-0.125 inches) and the variation in line capacitance to plus and minus 20%. This tight control over line length reduces the uncertainty of propagation delays to approximately 15 to 25 picoseconds.

Line capacitance is hard to control, because it is affected by over and under etching of the copper plate during fabrication and by variations in the dielectric constant of the plastic materials used to make the wiring board. The epoxy glass material commonly used, G-10, has a dielectric constant of 4.7 but it is assumed that it can vary 10% from lot to lot.

Ringing of the clock lines is hard to quantify in the design of a panel board, mainly because it is determined to a great extent by the number and types of loads that the user puts on each line. By adjusting the value of the resistors in the terminating network, it usually possible to reduce ringing to about 10 to 15% of the clock signal.

In view of these many variables which the technician/designer must consider, and many more of which have not been adequately identified or discussed above, the invention is not to be considered as being limited to the specific embodiments described and shown herein but rather should be limited only by the scope of the appended claims.

I claim:

1. A multi-layered printed circuit board for mounting and interconnecting the terminals of multi-terminal electronic components, said circuit board comprising:
   means for mounting electronic components on one side of said circuit board;
   means for interconnecting the terminals of the electronic components; and
   a transmission line arrangement configured from layers of said circuit board for distributing a signal with fast rise and fall times to the electronic components mounted on said circuit board, said transmission line arrangement including a narrow conductive strip surrounded by four constant voltage conductors spaced from said narrow conductive strip by dielectric material, said transmission line arrangement further comprising at least two layers of dielectric material, said narrow conductive strip carrying said signal along a conductive path between said two layers of dielectric material, and said constant voltage conductors comprising a first planar conductive layer above said narrow conductive strip and spaced therefrom by one of said dielectric layers, a second planar conductive layer below said narrow conductive strip and spaced therefrom by the other of said dielectric layers, and a pair of coplanar conductive strips between said two layers of dielectric material and lying parallel to and coplanar with said narrow conductive strip, one on each side of said narrow conductive strip; wherein:

the geometry of said narrow conductive strip, the distance between said narrow conductive strip and the surrounding first and second planar conductive layers and pair of coplanar conductive strips, and the characteristics of said dielectric material, are chosen to define a predetermined characteristic impedance for said transmission line arrangement; and one of said electronic components is a signal distributor for distributing said signal along a plurality of conductive paths, each path consisting of the elements making up said transmission line arrangement, thereby defining a plurality of transmission line arrangements distributing said signal to separate regions of said circuit board.

2. The multi-layered printed circuit board as claimed in claim 1, wherein:

said transmission line arrangement has a sending end and a terminating end for distribution of said signal along said path to surface mounted components; and said circuit board comprises a termination network at the terminating end of said transmission line arrangement, said termination network having the same equivalent impedance as said characteristic impedance of said transmission line arrangement.

3. The multi-layered printed circuit board as claimed in claim 1, wherein each path is the same length from its sending end to its terminating end and exhibits the same capacitance.

4. The multi-layered printed circuit board as claimed in claim 1 wherein said circuit board comprises a plurality of additional conductive and dielectric layers, said additional conductive layers including voltage planes separated by additional ones of said dielectric layers.

5. The multi-layered printed circuit board as claimed in claim 4, wherein said conductive layers include signal interconnecting conductive layers separated by said dielectric layers.

6. The multi-layered printed circuit board as claimed in claim 1, wherein said conductive layers and strips and said two layers of dielectric material making up said transmission line arrangement are embedded within a larger number of conductive and dielectric layers making up said multi-layered printed circuit board.

7. The multi-layered printed circuit board as claimed in claim 1, wherein said first and second planar conductive layers are voltage planes at ground potential.

8. The multi-layered printed circuit board as claimed in claim 1, wherein said coplanar conductive layers are at ground potential.

9. The multi-layered printed circuit board as claimed in claim 1, wherein the thickness of said dielectric layers are equal and equal to the lateral distance between said narrow conductive strip and each said coplanar conductive strip.

10. The multi-layered printed circuit board as claimed in claim 9, wherein said thickness and distance are about 0.03 inches.

11. The multi-layered printed circuit board as claimed in claim 9, wherein the width of said narrow conductive strip is in the range of about 0.001 to 0.010 inches.

12. The multi-layered printed circuit board as claimed in claim 11, wherein the width of said narrow conductive strip is in the range of 0.005 to 0.007 inches.

13. The multi-layered printed circuit board as claimed in claim 1, comprising a plurality of said transmission line arrangements each having layers of dielectric material mutually exclusive from the layers of dielectric material of any other transmission line arrangement.

14. A multi-layered printed circuit board for mounting and interconnecting the terminals of multi-terminal electronic components, said circuit board comprising:

means for mounting electronic components on one side of said circuit board;

means for interconnecting the terminals of the electronic components; and a transmission line arrangement configured from layers of said circuit board for distributing a signal with fast rise and fall times to the electronic components mounted on said circuit board, said transmission line arrangement including a narrow conductive strip surrounded by four constant voltage conductors spaced from said narrow conductive strip by dielectric material; wherein said circuit board comprises a plurality of wire-interconnect terminals passing through said board, said interconnecting means being implemented by connecting wires terminal to terminal on said board.

15. A multi-layered printed circuit board for mounting said interconnecting the terminals of multi-terminal electronic components, said circuit board comprising:

means for mounting electronic components on one side of said circuit board;

means for interconnecting the terminals of the electronic components; and a transmission line arrangement configured from layers of said circuit board for distributing a signal with fast rise and fall times to the electronic components mounted on said circuit board, said transmission line arrangement including a narrow conductive strip surrounded by four constant voltage conductors spaced from said narrow conductive strip by dielectric material, said transmission line arrangement further comprising at least two layers of dielectric material, said narrow conductive strip carrying said signal along a conductive path between said two layers of dielectric material, and said constant voltage conductors comprising a first planar conductive layer above said narrow conductive strip and spaced therefrom by one of said dielectric layers, a second planar conductive layer below said narrow conductive strip and spaced therefrom by the other of said dielectric layers, and a pair of coplanar conductive strips between said two layers of dielectric material and lying parallel to and coplanar with said narrow conductive strip, one on each side of said narrow conductive strip; wherein:

the geometry of said narrow conductive strip, the distance between said narrow conductive strip and the surrounding first and second planar conductive layers and pair of coplanar conductive strips, and the characteristics of said dielectric material, are chosen to define a predetermined characteristic impedance for said transmission line arrangement; and said printed circuit board further comprise a plurality of taps to said narrow conductive along said path, each tap including a terminal extending from one side of said circuit board for access to said signal being distributed along said transmission line arrangement.

16. The multi-layered printed circuit board as claimed in claim 15, wherein said terminal is a wire-wrap terminal.

17. The multi-layered printed circuit board as claimed in claim 15, wherein the area of said narrow strip at the region of said tap is widened with smooth transitions for making connection to said terminal, and the geometry of said coplanar conductive strips at said tap region is adjusted to maintain said characteristic impedance at said tap.

18. A multi-layered printed circuit board for mounting and interconnecting the terminals of multi-terminal electronic components, said circuit board comprising:
  means for mounting electronic components on one side of said circuit board;
  means for interconnecting the terminals of the electronic components; and
  a transmission line arrangement configured from layers of said circuit board for distributing a signal with fast rise and fall times to the electronic components mounted on said circuit board, said transmission line arrangement including a narrow conductive strip surrounded by four constant voltage conductors spaced from said narrow conductive strip by dielectric material, said transmission line arrangement further comprising at least two layers of dielectric material, said narrow conductive strip carrying said signal along a conductive path between said two layers of dielectric material, and said constant voltage conductors comprising a first planar conductive layer above said narrow conductive strip and spaced therefrom by one of said dielectric layers, a second planar conductive layer below said narrow conductive strip and spaced therefrom by the other of said dielectric layers, and a pair of coplanar conductive strips between said two layers of dielectric material and lying parallel to and coplanar with said narrow conductive strip, one on each side of said narrow conductive strip; wherein
  said printed circuit board further comprises a filter network for filtering said first and second planar conductive layers and said pair of coplanar conductive strips to produce constant voltage on said first and second planar conductive layers and said pair of coplanar conductive strips.

19. A multi-layered printed circuit board for mounting and interconnecting the terminals of multi-terminal electronic components, said circuit board comprising:
  a plurality of interconnect terminals passing through said board providing means for mounting the electronic components on one side of said circuit board and means for interconnecting the terminals of the electronic components; and
  a transmission line arrangement configured from layers of said circuit board for distributing a signal with fast rise and fall times to the electronic components mounted on said circuit board, said transmission line arrangement including a narrow conductive strip carrying said signal along a conductive path, said narrow conductive strip surrounded on at least two sides by constant voltage conductors spaced from said narrow conductive strip by dielectric material, said transmission line arrangement further comprising at least two layers of dielectric material, said narrow conductive strip carrying said signal along a conductive path between said two layers of dielectric material, and said constant voltage conductors comprise:
  a first planar conductive layer above said narrow conductive strip and spaced therefrom by one of said dielectric layers;
  a second planar conductive layer below said narrow conductive strip and spaced therefrom by the other of said dielectric layers; and
  a pair of coplanar conductive strips between said two layers of dielectric material and lying parallel to and coplanar with said narrow conductive strip, one on each side of said narrow conductive strip.

20. The multi-layered printed circuit board as claimed in claim 19, wherein:
  said transmission line arrangement has a sending end and a terminating end for distribution of said signal along said path; and
  said circuit board comprises a termination network at the terminating end of said transmission line arrangement, said termination network having the same equivalent impedance as said characteristic impedance of said transmission line arrangement.

21. The multi-layered printed circuit board as claimed in claim 19, wherein said conductive layer and strips and said two layers of dielectric material making up said transmission line arrangement are embedded within a larger number of conductive and dielectric layers making up said multi-layered printed circuit board.

22. A multi-layered printed circuit board for mounting and interconnecting the terminals of multi-terminal electronic components, said circuit board comprising:
  a plurality of interconnect terminals passing through said board providing means for mounting the electronic components on one side of said circuit board and means for interconnecting the terminals of the electronic components;
  a transmission line arrangement configured from layers of said circuit board for distributing a signal with fast rise and fall times to the electronic components mounted on said circuit board, said transmission line arrangement including a narrow conductive strip carrying said signal along a conductive path, said narrow conductive strip surrounded on at least two sides by constant voltage conductors spaced from said narrow conductive strip by dielectric material; and
  a plurality of taps to said narrow conductive strip along said path, each tap including an interconnect terminal extending from one side of said circuit board for access to said signal being distributed along said transmission line arrangement.

23. The multi-layered printed circuit board as claimed in claim 22, wherein said interconnect terminal is a wire-wrap terminal.

24. The multi-layered printed circuit board as claimed in claim 22, wherein the area of said narrow strip at the region of said tap is widened for making connection to said pin, and the geometry of said coplanar conductive strips at said tap region is adjusted to maintain said characteristic impedance at said tap.

* * * * *